United States Patent [19]
Jech et al.

[11] Patent Number: 6,114,048
[45] Date of Patent: Sep. 5, 2000

[54] FUNCTIONALLY GRADED METAL SUBSTRATES AND PROCESS FOR MAKING SAME

[75] Inventors: David E. Jech; Jordan P. Frazier; Richard H. Sworden; Juan L. Sepulveda, all of Tucson, Ariz.

[73] Assignee: Brush Wellman, Inc., Cleveland, Ohio

[21] Appl. No.: 09/148,126

[22] Filed: Sep. 4, 1998

[51] Int. Cl.$^7$ .................................. B22F 7/00; B22F 3/26
[52] U.S. Cl. ...................... 428/547; 228/246; 257/720; 257/796; 361/679; 361/704; 361/705; 361/707; 361/708; 361/709; 361/719; 419/6; 419/7; 419/8; 419/9; 419/10; 419/27; 419/38; 419/66; 428/550; 428/553; 428/555; 428/567; 428/569; 428/577; 428/610; 428/613; 428/618; 428/620; 428/627; 428/634; 428/637; 428/649; 428/650; 428/655; 428/656; 428/686
[58] Field of Search ...................... 428/547, 550, 428/553, 555, 567, 569, 577, 610, 613, 618, 620, 637, 649, 650, 655, 656, 686, 627, 634; 419/6, 7, 8, 9, 10, 27, 38, 66; 75/245, 249, 255; 228/246; 257/720, 796; 361/679, 705, 704, 707, 708, 709, 719

[56] References Cited

U.S. PATENT DOCUMENTS

| | | | |
|---|---|---|---|
| 3,399,332 | 8/1968 | Savolainen et al. | 257/746 |
| 3,590,327 | 6/1971 | Thomae | 361/679 |
| 3,694,699 | 9/1972 | Snyder et al. | 361/705 |
| 3,801,381 | 4/1974 | Van Thyne et al. | 148/317 |
| 3,840,889 | 10/1974 | O'Brien et al. | 372/36 |
| 3,870,776 | 3/1975 | McMahon | 419/19 |
| 4,025,997 | 5/1977 | Gernitis et al. | 428/621 |
| 4,066,839 | 1/1978 | Cossutta et al. | 174/52.2 |
| 4,589,542 | 5/1986 | Steadman | 198/782 |
| 4,811,166 | 3/1989 | Alvarez et al. | 361/717 |
| 4,859,542 | 8/1989 | Begg et al. | 428/547 |
| 4,866,571 | 9/1989 | Butt | 361/717 |
| 4,870,377 | 9/1989 | Brown et al. | 333/238 |
| 5,008,737 | 4/1991 | Burnham et al. | 257/712 |
| 5,049,184 | 9/1991 | Harner et al. | 75/246 |
| 5,099,310 | 3/1992 | Osada et al. | 361/718 |
| 5,113,315 | 5/1992 | Capp et al. | 361/704 |
| 5,126,102 | 6/1992 | Takahashi et al. | 419/27 |
| 5,130,771 | 7/1992 | Burnham et al. | 257/720 |
| 5,200,641 | 4/1993 | Kosaki | 257/720 |
| 5,355,281 | 10/1994 | Adelmann et al. | 361/707 |
| 5,386,339 | 1/1995 | Polinski, Sr. | 361/719 |
| 5,493,153 | 2/1996 | Arikawa et al. | 257/796 |
| 5,514,327 | 5/1996 | Schneider | 419/36 |

(List continued on next page.)

FOREIGN PATENT DOCUMENTS 0 424 858   5/1991   European Pat. Off. .

OTHER PUBLICATIONS

International Search Report for PCT/US99/20157.

Primary Examiner—Deborah Jones
Assistant Examiner—Robert R. Koehler
Attorney, Agent, or Firm—Calfee, Halter & Griswold, LLP

[57] ABSTRACT

The invention provides for a functionally-graded metal substrate that is made of at least two metal compositions, a functional insert and a surrounding body that surrounds the functional insert. In a preferred embodiment of the invention a functional insert powder composition of loose powder metal is placed in a compact of a surrounding body powder composition and both metal compositions are sintered in a sintering furnace to form a sintered part. The sintered part is infiltrated in part or in whole with a molten metal compound to produce a functionally graded metal substrate having a density of at least 90% of theoretical. A heat-generating component such as a chip can be attached to the metal substrate for use in microelectronic packaging. When the functionally-graded metal substrate has two discrete compositions of copper/tungsten the surrounding body which has a CTE that ranges from about 5.6ppm/° C. to about 7 ppm/° C. constrains the expansion of the functional insert which has a thermal conductivity that ranges from about 200 W/mK to about 400 W/mK.

41 Claims, 3 Drawing Sheets

U.S. PATENT DOCUMENTS

| | | | |
|---|---|---|---|
| 5,552,107 | 9/1996 | Casey et al. | 419/13 |
| 5,552,232 | 9/1996 | Casey et al. | 428/547 |
| 5,608,267 | 3/1997 | Mahulikar et al. | 257/796 |
| 5,623,394 | 4/1997 | Sherif et al. | 361/705 |
| 5,682,589 | 10/1997 | Casey et al. | 419/13 |
| 5,686,676 | 11/1997 | Jech et al. | 75/247 |
| 5,878,322 | 3/1999 | Polese | 419/38 |
| 5,886,269 | 3/1999 | Kai et al. | 75/245 |
| 5,886,407 | 3/1999 | Polese et al. | 257/706 |

FUNCTIONALLY GRADED METAL SUBSTRATES AND PROCESS FOR MAKING SAME

FIELD OF INVENTION

This invention relates generally to a process for producing metal substrates and the resultant metal substrates. More specifically, this invention relates to a process for making metal substrates and the resulting metal substrates having two or more discrete portions of metal compositions.

BACKGROUND

Metal substrates are usually made of a single metal, a single metallic alloy, a single metal matrix composite (MMC) or a combination of clad metallic film layers. Metal substrates made of metal matrix composites, in particular, offer broad design flexibility because an MMC is a composite that contains at least two metals, one of which is a substantially higher melting refractory metal or reinforcement compound. A substrate that is an MMC can be tailored to control certain physical characteristics, such as mechanical, thermal, electrical, and chemical properties by varying the relative proportions of the two or more metals to satisfy end use specification requirements.

Metal substrates have long been used in microelectronic packaging to house circuit chips, dice, electrical components, and the like. In such applications, one or more heat-generating components are mounted on a metal substrate that is conventionally termed a flange or a carrier substrate. Once these components are mounted, the carrier substrate is usually mounted on a printed circuit card or circuit board. Metallic carrier substrates are good electrical conductors and are especially suited to house components or chips that require electrical grounding. For example, an application in which chip grounding is necessary is laterally diffuse metal oxide semiconductors (LDMOS) which house field effect transistors (FET).

When a carrier substrate is used for microelectronic packaging, the thermal conductivity (TC) and the coefficient of thermal expansion (CTE) are among the most important properties considered in the design of carrier substrates. The carrier substrate is generally made of a material having high thermal conductivity so that there is high heat transfer away from the heat-generating component. Microelectronic packages must also be dimensionally stable to prevent warping, delamination between the chip and the carrier substrate, or even cracking of the chip during thermal cycling. Thus, the carrier substrate must be designed such that its thermal expansion approximately matches or is slightly higher than the expansion of the chip. Typically, the CTE of a chip is about 2.8 ppm/° C. for a silicon chip and about 5.6 ppm/° C. for a gallium arsenide chip, for example.

A common problem in the design of microelectronic packages, however, is that material candidates having high thermal conductivity also have a high CTE. For example, copper has a thermal conductivity of about 400 W/mK, however, the CTE of copper is about 17 ppm/° C. Thus, a metal substrate containing a high concentration of copper yields unacceptable results in most microelectronics applications. Compared to metal substrates made of a single metal or metallic alloy, MMC carrier substrates can be better designed to match the thermal expansion characteristics of the chip or other heat-generating component attached to the carrier substrate while also providing improved heat transfer. For example, copper/tungsten and copper/molybdenum composites are commonly used in electronic packaging applications and have a thermal conductivity that ranges from about 130 W/mK to about 180 W/mK depending on the copper content of the composite. This is considerably less than the thermal conductivity of copper.

While MMCs offer broad design flexibility, certain end use performance characteristics of metal substrates are compromised due to the homogeneity of the metal substrates in the x-y plane. It is desirable to provide a metal substrate that has at least two discrete portions of material compositions in the x-y plane with each material composition having distinct material properties. It is desirable to provide a metal substrate that has improved thermal conductivity to dissipate heat generated by a die situated in a localized area as well as a surrounding area that constrains the expansion of such localized area. It is also desirable to produce a metal substrate that can be used in microelectronic packaging to improve heat dissipation of chips and heat-generating components while maintaining dimensional stability and minimal warpage during thermal cycling. It is further desirable to produce a functionally graded metal substrate that achieves these objectives at a lower cost.

SUMMARY OF THE INVENTION

The invention herein provides for a functionally-graded metal substrate that is made of at least two metal compositions and has at least two discrete portions, a functional insert and a surrounding body, in the x-y plane. The functional insert is intimately bonded to the surrounding body. The functionally-graded metal substrate is characterized by two or more discrete portions each having different mechanical properties, thermal properties, electrical and magnetic properties, chemical composition or aesthetic features.

When the functionally-graded metal substrate is used in microelectronic packaging applications a heat generating chip is attached directly to the functional insert which is surrounded by the surrounding body. The functional insert preferably has a thermal conductivity that is greater than the thermal conductivity of the surrounding body. The functional insert conducts heat away from the chip to the environment or to a heat sink. Although the CTE of the functional insert is higher than the CTE of the surrounding body, the otherwise detrimental expansion of the functional insert is constrained by the surrounding body when the temperature of the microelectronic package increases.

The process for making functionally-graded metal substrates comprises: filling the cavity of a metal body with a functional insert and sintering the metal body and the functional insert simultaneously. In another embodiment of the invention, the process further comprises infiltrating the sintered metal body or the sintered functional insert or both with a molten metal compound.

In accordance with a preferred embodiment of the invention the metal body is a compact of powder metal or a surrounding body powder composition, and the functional insert is a loose powder metal or functional insert powder composition. The preferred process comprises: compacting a surrounding body powder composition to form a compact having a cavity therein, filling the cavity with a functional insert powder composition that is preferably a loose powder, sintering the surrounding body powder composition and the functional insert powder composition simultaneously, and infiltrating the sintered surrounding body or sintered functional insert or both with a molten metal. The cavity can be formed while forming the compact or after the compact is formed. The resulting functionally-graded metal substrate has two discrete portions, a functional insert and a surrounding body that surrounds the functional insert, preferably, in two dimensions in the x-y plane.

In a particularly preferred embodiment of the invention, the functional insert powder composition and the surrounding body powder composition both comprise either copper and tungsten or copper and molybdenum. The concentration of copper in the functional insert powder composition is greater than the concentration of copper in the surrounding body powder composition. The cavity formed for making the functional insert portion of the substrate preferably extends from a first surface of the compact to a second surface of the compact, such as from the top to the bottom of the compact, for example. Upon sintering, the sintered functional insert composition has a greater porosity than the sintered surrounding body composition, and upon infiltration, the sintered functional insert composition achieves full density. The result is a functionally-graded metal substrate that has a density greater than at least about 90% of theoretical throughout.

The resulting functionally-graded metal substrate finds particular use in housing microelectronic components. A heat-generating component, such as, for example a chip, can be attached directly to the functional insert. The functional insert which can have a thermal conductivity up to about 400 W/mK, is preferably greater than the thermal conductivity of the surrounding body. The surrounding body preferably has a CTE that is lower than the CTE of the functional insert, and thus the surrounding body controls or constrains the expansion of the functional insert along its contact surfaces as the functional insert conducts heat away from the heat-generating component.

In another embodiment of the invention, the process for making functionally-graded metal substrates comprises: compacting a surrounding body powder composition to form a compact having a cavity therein, compacting a functional insert powder composition to form a compact, filling the cavity with the compact of functional insert powder composition, and sintering the functional insert powder composition and the surrounding body powder composition.

Alternative embodiments of the invention also include sintering a solid metal surrounding body having a cavity therein containing a functional insert powder composition to form a functionally-graded metal substrate, or diffusion bonding or brazing a solid metal functional insert to a solid metal surrounding body. Infiltration can follow sintering in embodiments which include sintering the surrounding body containing a functional insert powder composition or a compact of insert powder composition.

DESCRIPTION OF THE DRAWINGS

The present invention may be more readily understood by reference to the following drawings wherein.

DETAILED DESCRIPTION OF THE INVENTION

The invention herein provides for a process for making a functionally-graded metal substrate and the resulting substrate that has at least two discrete areas, a functional insert and a surrounding body, in the x-y plane. The functional insert is surrounded by the surrounding body, preferably, in at least two dimensions. The discrete areas of the functionally-graded metal substrate have distinct physical characteristics which are governed by the metal composition in each discrete area.

The functionally-graded metal substrate comprises at least two metal compositions that represent at least one surrounding body and at least one functional insert. Metals that make up the surrounding body and the functional insert can include an elemental metal, a metallic alloy or a metal matrix composite (MMC). The functional insert and the a surrounding body may include the same metals but in varying concentrations or compositions. Materials that can be used according to the invention herein include, for example: metals such as copper, nickel, iron, beryllium, aluminum, silver; metallic alloys such as copper beryllium, copper-zinc (bronze), copper-tin (brass), 64% iron/36% nickel (Invar™) and 54% iron/29% nickel/17% cobalt (Kovar™), copper-iron, nickel-niobium, nickel-silver, nickel-copper, iron-copper, iron-copper-carbon, iron-copper-nickel, iron-chromium, iron-copper-tin, copper-nickel-titanium-aluminum, nickel-copper-titanium; and metal matrix composites such as copper/tungsten, copper/ molybdenum, aluminum/silicon carbide, aluminum/ aluminum nitride, copper/aluminum, silver/Invar™, copper/ cubic boron nitride, copper/diamond and copper/high conductivity carbon fiber.

When the functionally-graded substrate having two different metal compositions is used in microelectronic applications, a heat-generating component, for example, a chip, is attached directly to the functional insert and the functional insert is surrounded by the surrounding body. The functional insert preferably has a thermal conductivity that is greater than the thermal conductivity of the surrounding body, and the surrounding body preferably has a CTE that is lower than the CTE of the functional insert. The surrounding body thus controls or constrains the expansion of a functional insert along its bonded surfaces as the functional insert conducts heat away from the heat-generating component.

In accordance with the invention herein, a process for making a functionally-graded metal substrate comprises: filling the cavity of a metal body with a functional insert and sintering the metal body and the functional insert simultaneously. In another embodiment the process further comprises infiltrating the sintered metal body or the sintered functional insert or both with a molten metal compound. The result is a functionally-graded metal substrate having a functional insert and a surrounding body that surrounds the functional insert, preferably in at least two dimensions, in the x-y plane.

Figure 1A:
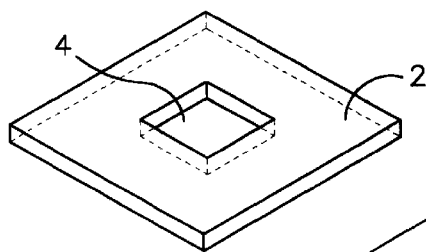
FIG. 1(a) is a perspective view of a compact of a surrounding body powder composition with a cavity formed therein in accordance with the present invention.
Figure 1B:
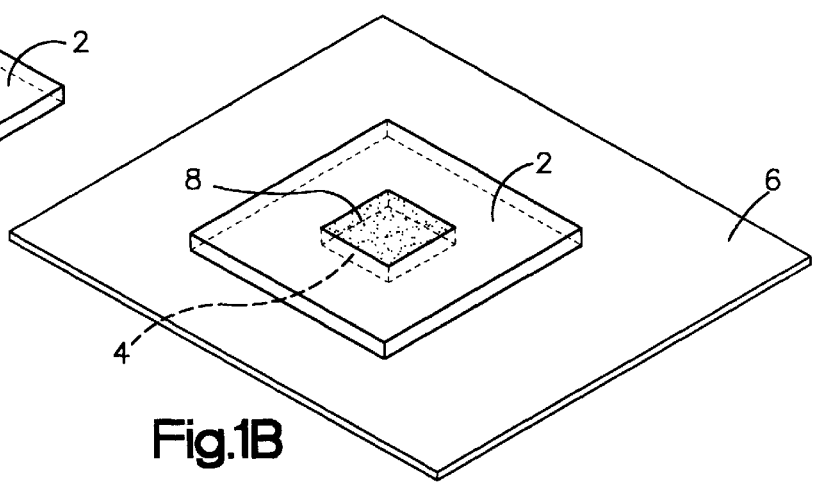
FIG. 1(b) is a perspective view of the compact of FIG. 1(a) showing loose insert powder composition placed within the cavity in accordance with the preferred embodiment of the invention.
Figure 2:
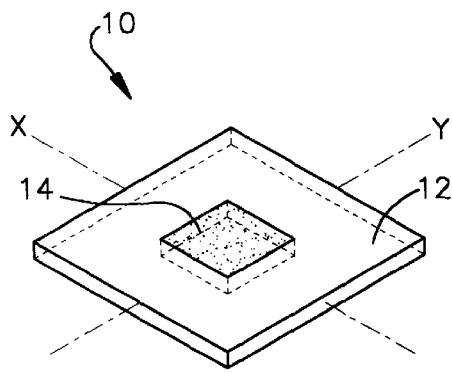
FIG. 2 is a perspective view of a functionally-graded metal substrate having two discrete portions of material composition in the x-y plane.

In accordance with a preferred embodiment of the invention, the metal body is made from a compact of a surrounding body powder composition, and the functional insert is made from a functional insert powder composition. FIG. 1(a) shows a surrounding body powder composition 2, which is pressed preferably with cavity 4 formed therein. FIG. 1(b) shows the pressed compact containing the surrounding body powder composition on alumina sintering plate or sagger plate 6 and functional insert powder composition 8 in cavity 4. Functional insert powder composition 8 is preferably a spray-dried powder and is placed in a loosely packed arrangement. Metal powders that can be used for the surrounding body powder composition and the functional insert powder composition can be any metal powders that are used in metal sintering processes and are well known in the art.

The sintering plate is then placed in a sintering furnace and fired at a temperature such that sintering causes the insert powder composition to bond with the surrounding body powder composition. The surrounding body powder composition is sintered to a density that is at least 90% of theoretical, preferably at least 97% of theoretical, and even more preferably at least 99% of theoretical. The sintered functional insert composition is porous after sintering having a density that is less than the density of the sintered surrounding body and preferably about 70% or less of theoretical.

Next, the sintered functional insert composition is infiltrated with molten metal such that the sintered functional insert achieves a density of at least 90% of theoretical, preferably at least 97% of theoretical, and even more preferably at least 99% of theoretical. The result is a functionally-graded metal substrate having a functional insert and a surrounding body that surrounds the functional insert in at least two dimensions.

In accordance with a particularly preferred embodiment of the invention, the compact of surrounding body powder composition contains copper and tungsten powder comprising from about 5% to about 50% by weight copper, preferably, from about 5% to about 40%, and more preferably, from about 10% to about 30% by weight copper powder. Copper can be introduced in the compact in the form of copper powder or copper oxide powder or both. The functional insert powder composition comprises copper and tungsten powder that is from about 20% to about 80% by weight copper, preferably, from about 30% to about 50%, and more preferably, from about 30% to about 45% by weight copper powder. The functional insert powder composition is preferably sintered in loose powder form. The sintered functional insert composition is relatively porous infiltrated preferably with copper, and more preferably, oxygen-free high conductivity (OFHC) copper. Infiltration is conducted in a nitrogen/hydrogen environment at a temperature ranging between about 1100° C. and about 1150° C. to produce a functional core having high thermal conductivity relative to the surrounding body.

Alternatively, in another preferred embodiment the compact of surrounding body powder composition contains copper and molybdenum powder comprising from about 5% to about 50% by weight copper, preferably, from about 5% to about 40%, and more preferably, from about 10% to about 30% by weight copper powder. Copper can be introduced in the compact in the form of copper powder or copper oxide powder or both. The functional insert powder composition comprises copper and molybdenum powder that is from about 20% to about 80% by weight copper, preferably, from about 30% to about 50%, and more preferably, from about 30% to about 45% by weight copper powder. The functional insert powder composition is preferably sintered in loose powder form. The sintered functional insert composition is relatively porous infiltrated preferably with copper, and more preferably, oxygen-free high conductivity (OFHC) copper. Infiltration is conducted in a nitrogen/hydrogen environment at a temperature ranging between about 1100° C. and about 1150° C. to produce a functional core having high thermal conductivity relative to the surrounding body.

Figure 3:
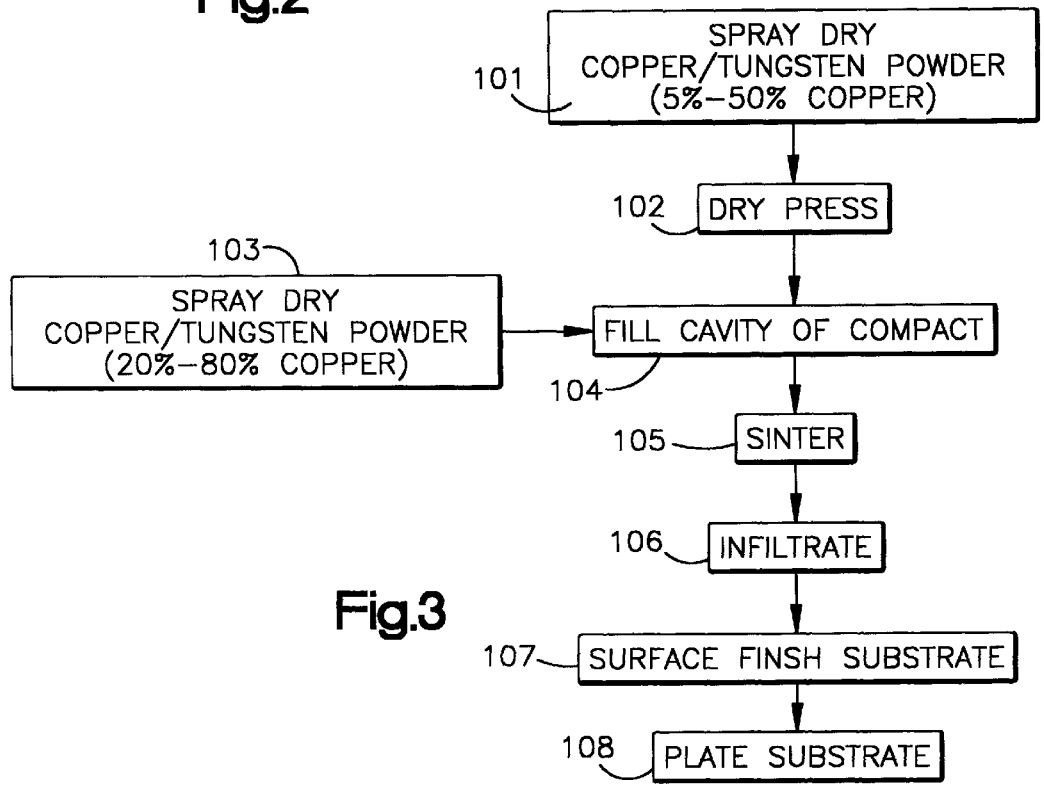
FIG. 3 is a flow scheme of the process for making functionally-graded metal substrates in accordance with the preferred embodiment of the invention herein.

The functionally-graded metal substrates of the invention herein can be used to house microelectronic components. FIG. 3 illustrates a flow scheme that summarizes the process for making copper/tungsten or copper/molybdenum functionally-graded metal substrates for microelectronic packages in accordance with the preferred embodiment of the invention. Copper/tungsten or copper/molybdenum spray dried powder is prepared 101 and then dry pressed to form a compact of the surrounding body having at least one cavity therein 102. Copper/tungsten functional insert powder comprising from about 20% to about 80% by weight copper is spray dried 103 and the functional insert powder composition in loose powder form, is placed in the cavity of the compact of the surrounding body powder composition 104. The compact of the surrounding body and the functional insert powder compositions are fired in a furnace during the sintering process 105. The functional insert composition undergoes infiltration 106 with copper to produce a functionally-graded metal substrate. Subsequently, the surfaces of the metal substrate are ground to desired dimensions 107 followed by metal plating 108 in preparation for further processing of the microelectronic package.

Figure 4:
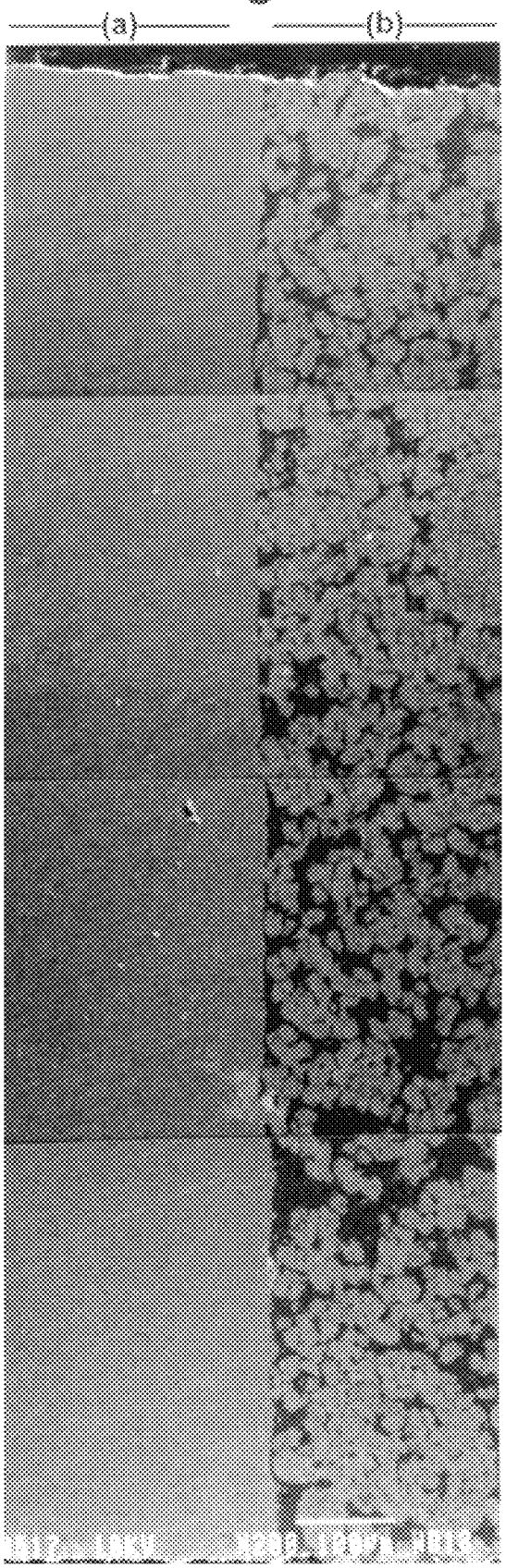
FIG. 4 is a scanning electronic microscope (SEM) micrograph of a cross-section of the functionally-graded metal substrate herein which shows the microstructure of the surrounding body designated by vertical (a) portion of micrograph, and the microstructure of functional insert designated by vertical (b) portion of the micrograph.

FIG. 4 is a scanning electronic microscope (SEM) micrograph of a cross-sectional area of the functionally-graded metal substrate in accordance with the invention herein. The surrounding body portion designated by vertical (a) portion of the micrograph contains copper/tungsten metal matrix composite containing from about 15% by weight copper and about 85% by weight tungsten. The functional insert portion designated by vertical (b) portion of the micrograph is a copper/tungsten metal matrix composite containing from about 40% by weight copper and about 60% by weight tungsten.

Figure 5:
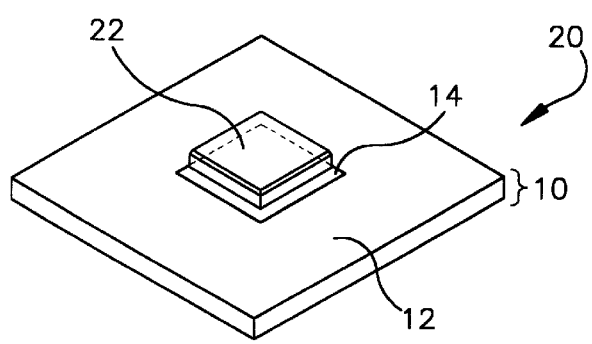
FIG. 5 is a perspective view of a chip mounted directly onto the functional insert portion of the functionally-graded metal substrate for microelectronic packaging.

FIG. 5 illustrates functionally-graded metal substrate 10 as a carrier substrate of a microelectronic package 20. Heat-generating chip 22 is attached directly to functional insert 14 by brazing, soldering, epoxy adhesive or attachment means that are well known in the art. Functional insert 14 conducts heat away from heat-generating chip 22 to the environment or to a heat sink attached thereon (not shown). Preferably, functional insert 14 has a thermal conductivity that is greater than the thermal conductivity of the surrounding body and surrounding body 12 has a CTE that is lower than the CTE of functional insert 14. The CTE of surrounding body approximately matches or is slightly greater than the CTE of the heat-generating chip and controls the expansion of the functional insert during thermal cycling. For example, a functionally-graded substrate in which the functional insert and the surrounding body are comprised of copper/tungsten or copper/molybdenum, the functional insert has a thermal conductivity that ranges from about 200 W/mK to about 400 W/mK and the surrounding is body has a CTE that ranges from about 5.6 ppm/° C. to about 7 ppm/° C. where the CTE is measured at ambient temperature. Thus, a metal substrate having a functional insert with high thermal conductivity improves the thermal dissipation of the metal substrate while maintaining low thermal expansion in the area where the chip is attached.

The process of making spray-dried agglomerates from powder metal compositions and the process of compaction, sintering, and infiltration are well known in the art. These processes are described in U.S. Pat. No. 5,686,676 which is hereby incorporated by reference herein. Metal powders are mixed by means of mechanical mixers such as high shear mixers, blenders and mills in the presence of a liquid, preferably water. Once the metal powders are mixed, they can be formed into a compact in any conventional manner. For example, a free flowing agglomerate powder is poured into a die and pressed with either a hydraulic or mechanical press to form a compact. The dimensions of the compact are determined by the size of the desired finished part and the die, taking into account the shrinkage of the compact during the sintering operation. Sintering is preferably accomplished using either a batch furnace or a continuous pusher type furnace. Sintering residence time and temperature depends upon the melting temperature or the eutectic temperature of the metal powder composition. The sintering temperature is greater than at least one metal of the powder metal compositions. Infiltration is well known in the art and metal compositions that are used for infiltration are generally those having a melting temperature of about 1400 deg. C or less.

It has been found that if one of the powder compositions that is used contains a metal that is capable of forming a eutectic composition, then a denser substrate can be produced. This phenomenon is described in U.S. Pat. No. 5,686,676 which is hereby incorporated by reference herein. An example of a powder metal system that can form a eutectic composition during sintering is copper-copper oxide. Sintering compacts containing copper oxide or a combination of copper and copper oxide is conducted at temperatures from about 1050° C. to about 1400° C. Even more preferably, the compacts can be sintered in a reducing atmosphere, which for example, contains hydrogen, nitrogen or moisture, for example.

In accordance with another embodiment of the invention, the process comprises: compacting a surrounding body powder composition to form a compact having a cavity therein, compacting a functional insert powder composition, filling the cavity with the compact of functional insert powder composition, and sintering the functional insert powder composition and the surrounding body powder composition simultaneously. The cavity can be formed in the compact of surrounding body powder composition while forming the compact or after the compact is formed.

Figure 6:
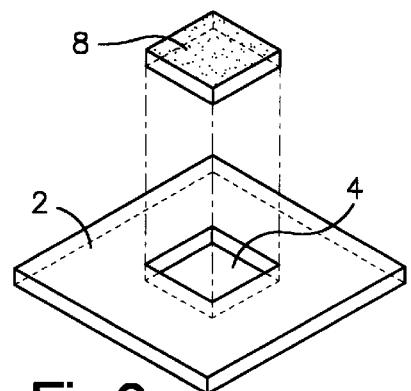
FIG. 6 is a perspective view of a compact containing functional insert powder composition prior to placement within the cavity of the compact of surrounding body powder composition in accordance with another embodiment of the invention.

FIG. 6 shows a compact containing functional insert powder composition 8 before it is placed into a compact containing surrounding body powder composition 2. The functional insert powder composition is pressed to a size that will fit into the cavity of the surrounding body composition. The two compacts are sintered together to a density that is at least about 90% of theoretical, preferably at least about 97% and at least about 99% of theoretical. Both powder metal compositions can be pressed in a single tool. A multi-action press having a specialized feedshoe (receptacle on tool to fill cavities) can be used to press both powder metal compositions in a single tool.

If the sintered part containing the sintered surrounding body and the sintered functional insert has a low density, for example, less than about 95% of theoretical, the sintered part can be infiltrated with molten metal. In another embodiment of the invention the process comprises: compacting a surrounding body powder composition to form a compact having a cavity therein, compacting a functional insert powder composition, filling the cavity with the compact of functional insert powder composition, sintering the functional insert powder composition and the surrounding body powder composition simultaneously, and infiltrating the sintered surrounding body or the sintered functional core or both.

In another embodiment of the invention the metal body is a solid, wrought metal body. The process for making a functionally-graded metal substrate comprises: placing a functional insert powder composition into the cavity of a solid surrounding body and sintering the functional insert powder composition. The cavity can be formed by machining the solid surrounding body or by other well-known techniques. In another embodiment the process further comprises infiltrating the sintered functional insert with a molten metal composition.

In yet another embodiment of the invention, the process for making a functionally-graded metal substrate comprises: placing a solid functional insert into the cavity of a solid surrounding body and brazing the solid functional insert to the solid surrounding body. The cavity can be formed by machining the solid surrounding body or by other well-known techniques. The solid, functional insert, preferably a wrought metal, is attached or bonded to the metal body using conventional brazing technology. Alternatively, the solid functional insert can be attached by either pressure-assisted or pressureless diffusion bonding to form a functionally-graded metal substrate.

After the functionally-graded metal substrate is made, it can undergo one or more secondary operations. End use dimensions can be achieved by double-disk grinding the metal substrate according to a process well known in the art. The functionally-graded metal substrate can also be plated by conventional plating processes, such as electroless plating or electrolytic plating, for example. More specifically, in a microelectronic packaging application, the functionally-graded metal substrate can be nickel plated or nickel and gold plated via electroless or electrolytic plating operations.

Figure 7:
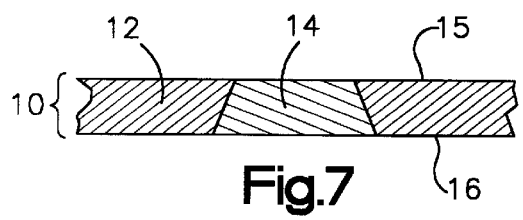
FIG. 7 is a cross-sectional view of a functionally-graded metal substrate showing a functional insert that has a tapered cross-sectional width.

The functional insert of the functionally-graded metal substrate can be any geometric shape. For example, FIG. 7 shows functional insert 14 has tapered or angled walls. The cross-sectional area of the functional core is increasingly larger toward the bottom of the functionally-graded metal substrate. The tapering can facilitate greater thermal dissipation from the top down if a heat-generating component is attached to functional insert 14, for example.

Figure 8:
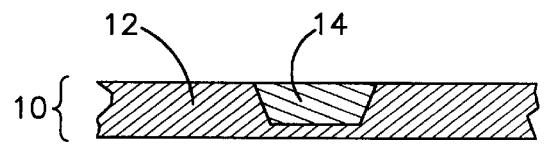
FIG. 8 is a cross-sectional view of a functionally-graded metal substrate showing a functional insert that extends from one surface of the substrate to another location within the surrounding body of the substrate.

The functional insert can extend partially or completely through the surrounding body. The functional insert of FIG. 7 shows that the functional insert extends from top surface 15 of functionally-graded metal substrate 10 to bottom surface 16. FIG. 8 shows functional insert 14 extends from the top surface of substrate 10 to a location within surrounding body 12.

Figure 9:
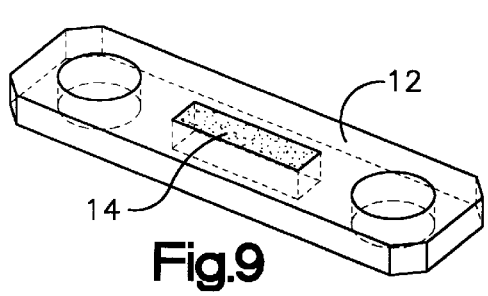
FIG. 9 is a perspective view of the functionally-graded metal substrate of another embodiment of the invention.
Figure 10:
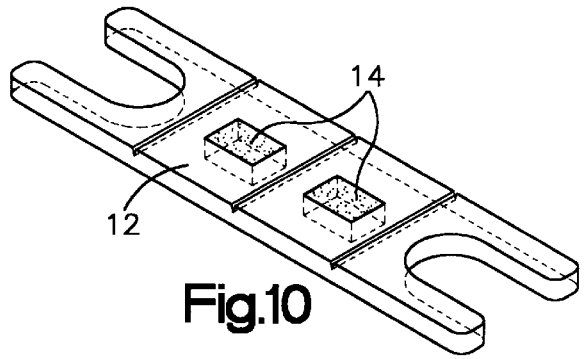
FIG. 10 is a perspective view of the functionally-graded metal substrate of another embodiment of the invention showing the functional inserts.
Figure 11:
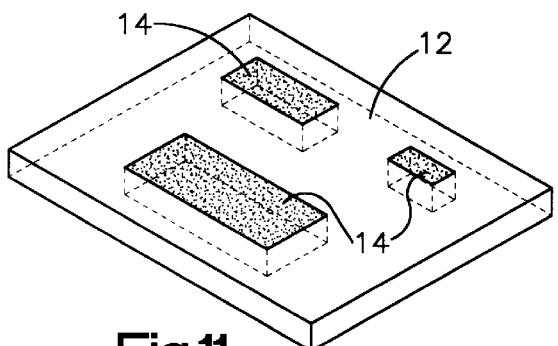
FIG. 11 is a perspective view of a functionally-graded metal substrate that has a plurality of functional inserts of varying sizes in accordance with the invention herein; and, FIG. 12 is a perspective view of an array of functionally-graded metal substrates in accordance with the invention herein.

Functionally-graded metal substrates can be made in a variety of shapes, sizes and configuration as shown in FIG. 9 and FIG. 10. In addition, the functionally-grade metal substrate herein can have one or many functional inserts. FIG. 11 shows a functionally-graded metal substrate that has a plurality of functional inserts of varying sizes and shapes. If used in microelectronic packaging, the functionally-graded metal substrate can house several components such as dice, diodes, resistors, and capacitors, for example. The functional inserts can be distributed throughout the substrate wherever needed per end use requirements. Limitations on the size of the functional insert or the volume of functional insert relative to the total volume of the functionally-graded metal substrate depends upon the end use application, desired performances, and the functional insert and surrounding metal compositions. Such limitations may be determined through routine experimentation by one skilled in the art. For example, if the functionally-graded metal substrate herein is used in microelectronic packaging, the volume of the functional insert relative to the total volume of the substrate must be large enough to physically accommodate a heat-generating component and to facilitate improved heat transfer. The surrounding body must be large enough to constrain the dimensional expansion of the functional insert which has a CTE that is greater than the surrounding body.

Figure 12:
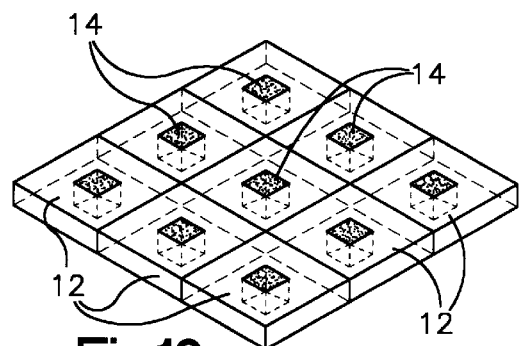

In addition, functionally-graded metal substrates can be made in an array which consists of a repeated pattern of metal substrates. An array of functionally-graded metal substrates is illustrated in FIG. 12. A large, functionally-graded metal substrate can be prescribed so that the array can be singulated into several individual metal substrates having a functional insert 14 and a surrounding body 12.

Figure 13:
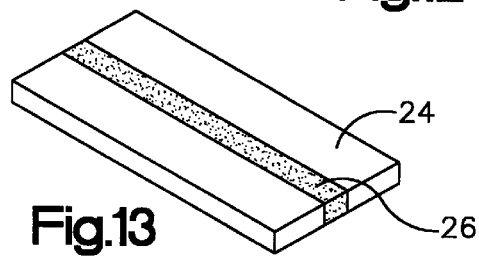
FIG. 13 is a perspective view of a functionally-graded metal substrate of the invention herein showing the surrounding body surrounds the functional insert in one dimension.

The several embodiments discussed provide for a surrounding body that surrounds the functional insert in the x-y plane. Preferably, the surrounding body surrounds the functional insert in at least two dimensions, but the surrounding body can also surround the functional insert in one dimension. FIG. 13 is a perspective view of a functionally-graded metal substrate in which the surrounding body 24 surrounds 26 the functional insert in one dimension.

In order to more fully and clearly describe the present invention so that those skilled in the art may better understand how to practice the present invention, the following examples are given. These examples are intended to illustrate the invention and should not be construed as limiting the invention disclosed and claimed herein in any manner.

Working Example

The following working example are provided to illustrate more thoroughly the present invention:

Heat Sink Made by Sintering and Infiltration
A. Preparation of Surrounding Body Powder Composition A copper/tungsten (15%/85% by weight) spray dried powder was made using the quantity of ingredients listed below.

| | |
|---|---|
| Tungsten | 423.6 lbs |
| Cuprous Oxide | 84.0 lbs |
| Deionized water | 105.1 lbs |
| Cobalt | 2.7 lbs |
| Isopropyl Alcohol | 18.5 lbs |
| Benzotriazole | 3.3 lbs |
| Acrylic Emulsion | 12.5 lbs |

Benzotriazole corrosion inhibitor (Cobratec® 99 available from PMC Specialties Group, Inc., Cincinnati, Ohio) was dissolved in isopropyl alcohol and particulate cuprous oxide was then added to the benotriazole solution. The mixture was set aside for 12 hours.

Deionized water and cobalt metal (mean particle size of about one micron) were mixed in a mixing tank for ten minutes. Next, tungsten metal (mean particle size of about one micron) was ball milled for about four hours and then slowly added to the ingredients in the mixing tank and mixed for two hours. The mixture of cuprous oxide, benzotriazole and isopropyl alcohol was added and mixed for 30 minutes. Rhoplex® B-60A acrylic emulsion was then added to the mixture which was then mixed for an additional 30 minutes. The mixture was recovered and spray dried in a Bowen No. 1 Tower spray drier at 25 psi and an outlet temperature of about 270° C. to about 280° C. The spray dried agglomerate powder, which after screening (65 mesh) exhibited a Hall meter flow rate of about 30 seconds per 50 grams of powder.

B. Preparation of Functional Core Powder Composition

A copper/tungsten (30%/70% by weight) functional powder composition was made by first making spray dried tungsten. Teledyne C-10 tungsten powder (306.8 grams) and deionized water (88 grams) were milled in a tumbling ball mill for three hours until the particle size of the tungsten was finer than about 10 microns. An acrylic emulsion, Rhoplex® B-60A, made by Rohm and Haas was screened through a 100 mesh screen before being weighed out in an amount of 5.2 grams. The Rhoplex was slowly added to the tungsten slurry and mixed for a minimum of ten minutes.

The mixture was then spray dried in a Bowen No. 1 Tower spray drier at 25 psi and an outlet temperature of about 270–280° C. The spray dried agglomerate powder after screening (65 mesh) exhibited a Hall flow rate of about 20 seconds per 50 grams of powder.

The spray dried tungsten powder (70 grams) was then blended with RL copper powder (30 grams) made by OMG Metal Products, Research Triangle Park, N. C. in a blending jar with a disrupter bar and blended for 5 minutes. The mixture was then screened through a 60 mesh screen.

C. Preparation of Compact and Sinter

Green compacts of the surrounding body powder composition were made by filling a die with copper/tungsten (15%/85%) powder from Step A and compressing the powder in a press at a pressure of 25,000 psi to form a green compact. The die was rectangular in shape and had a solid rectangular shaft built within. Thus, the resulting green compact had a through-hole that extended the thickness of the compact.

Next, the green compact was placed on alumina setter plates and the entire volume of the hole was filled with the functional powder composition described in step B above. The compact was sintered in a BTU reducing furnace at 1125° C. at a rate of one inch/min of the compact. The atmosphere in the BTU furnace was 100% hydrogen having a dew point of +20° C.

D. Infiltration

After the compact was sintered, the resulting sintered flange was placed on the setter for the infiltrating furnace. Oxygen-free high conductivity (OFHC) copper compacts or preforms were prepared for infiltration. Approximately 20% in excess of OFHC copper was placed on the area of the flange to be infiltrated, that is, the surface area of the flange that, prior to sintering, consisted of the functional powder composition. The sintered flange was then heated to 1100° C. in a dry (<−400C.) hydrogen/nitrogen (25%/75%) atmosphere for about 5 minutes. The result was a functionally-graded metal substrate having a functional insert and a surrounding body.

E. Secondary Finishing

The proper flatness and desired thickness of the functionally-graded metal substrate was achieved by double-disc grinding the surfaces. The heat sink was tumbled to remove the burrs. The metal substrate was nickel plated by the well-known electroless nickel plating process (plate/sinter/plate/sinter process) to a thickness of about 100 micro-inches of nickel. Finally, the metal substrate was electrolytically plated with gold to a thickness of about 75 micro inches and a flatness of about 0.2 to about 0.3 mils/inch.

Other modifications and variations of the present invention are possible in light of the above teachings. For example, the functional insert and the surrounding body of the functionally-graded metal substrate embodiments described herein can comprise a variety of metal compositions for use in end-use applications other than microelectronic applications. It is to be understood, however, that changes may be made in the particular embodiments described above which are within the full-intended scope of the invention as defined in the appended claims.

What is claimed is:

1. A functionally-graded metal substrate comprising:
   a functional insert;
   a surrounding body that surrounds the functional insert;
   wherein the functional insert and the surrounding body are two different metal compositions in the x-y plane of the substrate; and,
   wherein the functional insert has a higher thermal conductivity than the surrounding body and the surrounding body has a lower coefficient of thermal expansion than the functional insert.

2. The functionally-graded metal substrate of claim 1 wherein the surrounding body surrounds the functional insert in at least two dimensions.

3. The functionally-graded metal substrate of claim 1 wherein the functional insert extends from a top surface of the functionally-graded metal substrate to the bottom surface of the substrate.

4. The functionally-graded metal substrate of claim 1 wherein the functional insert extends from one surface of the substrate to an internal location of the substrate.

5. The functionally-graded metal substrate of claim 1 having a density of at least about 90% of theoretical.

6. The functionally-graded metal substrate of claim 1 wherein the functional insert comprises a metal composition selected from the group consisting of copper, nickel, iron, beryllium, aluminum, silver, copper-beryllium, copper-zinc (bronze), copper-tin (brass), 64% iron/36% nickel (Invar™), 54% iron/29% nickel/17% cobalt (Kovar™), copper-iron, nickel-niobium, nickel-silver, nickel-copper, iron-copper, iron-copper-carbon, iron-copper-nickel, iron-chromium, iron-copper-tin, copper-nickel-titanium-aluminum, nickel-copper-titanium, copper/tungsten, copper/molybdenum, aluminum/silicon carbide, aluminum/aluminum nitride, copper/aluminum, silver/Invar™, copper/cubic boron nitride, copper/diamond and copper/high conductivity carbon fiber and combinations thereof.

7. The functionally-graded metal substrate of claim 1 wherein the surrounding body comprises a metal composition selected from the group consisting of copper, nickel, iron, beryllium, aluminum, silver, copper-beryllium, copper-zinc (bronze), copper-tin (brass), 64% iron/36% nickel (Invar™) 54% iron/29% nickel/17% cobalt (Kovar™), copper-iron, nickel-niobium, nickel-silver, nickel-copper, iron-copper, iron-copper-carbon, iron-copper-nickel, iron-chromium, iron-copper-tin, copper-nickel -titanium-aluminum, nickel-copper-titanium, copper/tungsten, copper/molybdenum, aluminum/silicon carbide, aluminum/aluminum nitride, copper/aluminum, silver/Invar™, copper/cubic boron nitride, copper/diamond and copper/high conductivity carbon fiber and combinations thereof.

8. The functionally-graded metal substrate of claim 1 wherein the surrounding body is a copper/tungsten MMC containing from about 5% to about 50% by weight copper, and wherein the functional insert is a copper/tungsten MMC containing from about 20% to about 80% copper.

9. The functionally-graded metal substrate of claim 1 wherein the surrounding body is a copper/tungsten MMC containing from about 5% to about 40% by weight copper, and wherein the functional insert is a copper/tungsten MMC containing from about 30% to about 50% copper.

10. The functionally-graded metal substrate of claim 1 wherein the surrounding body is a copper/tungsten MMC containing from about 10% to about 30% by weight copper, and wherein the functional insert is a copper/tungsten MMC containing from about 30% to about 45% copper.

11. The functionally-graded metal substrate of claim 1 wherein both the surrounding body and the functional insert comprise copper/tungsten or copper/molybdenum, and wherein the concentration of copper in the functional insert is greater than the concentration of copper in the surrounding body.

12. The functionally-graded metal substrate of claim 1 further comprising:
   a heat-generating component attached thereon.

13. The functionally-graded metal substrate of claim 12 wherein the heat-generating component is attached to the functional insert and wherein the heat-generating component is a chip.

14. The functionally-graded metal substrate of claim 1 wherein the functional insert has a thermal conductivity that ranges from about 200 W/mK to about 400 W/mK and wherein the surrounding body has a CTE that ranges from about 5.6 ppm/° C. to about 7.0 ppm/° C.

15. A functionally-graded metal substrate comprising:
   a functional insert;
   a surrounding body;
      wherein the functional insert and the surrounding body are two different metal compositions in the x-y plane of the substrate, the functional insert having a hi,her thermal conductivity and higher coefficient of thermal expansion than the surrounding body and the surrounding body having a lower thermal conductivity and lower coefficient of thermal expansion than the functional insert;
      wherein the surrounding body surrounds the functional insert in at least two dimensions;
      wherein the functional insert extends from a top surface of the functionally-graded metal substrate to the bottom surface of the substrate;

wherein the functional insert comprises a metal composition selected from the group consisting of copper, nickel, iron, beryllium, aluminum, silver, copper-beryllium, copper-zinc (bronze), copper-tin (brass), copper-iron, nickel-niobium, nickel-silver, nickel-copper, iron-copper, iron-copper-carbon, iron-copper-nickel, iron-chromium, iron-copper-tin, copper-nickel-titanium-aluminum, nickel-copper-titanium, copper/tungsten, copper/molybdenum, aluminum/silicon carbide, aluminum/aluminum nitride, copper/aluminum, silver/Invar™, copper/cubic boron nitride, copper/diamond and copper/high conductivity carbon fiber and combinations thereof;

wherein the surrounding body comprises a metal composition selected from the group consisting of copper, nickel, iron, beryllium, aluminum, silver, copper-beryllium, copper-zinc (bronze), copper-tin (brass), 64% iron/36% nickel (Invar™), 54% iron/29% nickel/17% cobalt (Kovar™). copper-iron nickel-niobium, nickel-silver, nickel-copper, iron-copper, iron-copper-carbon, iron-copper-nickel, iron-chromium, iron-copper-tin, copper-nickel-titanium-aluminum, nickel-copper-titanium, copper/tungsten, copper/molybdenum, aluminum/silicon carbide, aluminum/aluminum nitride, copper/aluminum, silver/Invar™, copper/cubic boron nitride, copper/diamond and copper/high conductivity carbon fiber and combinations thereof; and, wherein the functionally-graded metal substrate has a density of at least about 90% of theoretical.

16. A functionally-graded metal substrate comprising:
a functional insert;
a surrounding body;
wherein the functional insert and the surrounding body are two different metal compositions in the x-y plane of the substrate;
wherein the functional insert has a higher thermal conductivity and higher coefficient of thermal expansion than the surrounding body, and the surrounding body has a lower thermal conductivity and lower coefficient of thermal expansion than the functional insert;
wherein the surrounding body surrounds the functional insert in at least two dimensions;
wherein the functional insert extends from a top surface of the functionally-graded metal substrate to the bottom surface of the substrate;
wherein the surrounding body is a copper/tungsten MMC containing from about 5% to about 50% by weight copper, and wherein the functional insert is a copper/tungsten MMC containing from about 20% to about 80% copper; and,
wherein the functional insert has a thermal conductivity that ranges from about 200 W/mK to about 400 W/mK and wherein the surrounding body has a CTE that ranges from about 5.6 ppm/° C. to about 7.0 ppm/° C.

17. The functionally-graded metal substrate of claim 16 further comprising:
A heat-generating component attached thereon.

18. A process for making a functionally-graded metal substrate, the process comprising:
filling the cavity of a metal body with a functional insert powder composition; and,
sintering the functional insert powder composition to produce a substrate having a functional insert that is bonded to a surrounding body.

19. The process of claim 18 wherein the metal body is comprised of a metal composition selected from the group consisting of copper, copper oxide, nickel, iron, beryllium, aluminum, silver, copper-beryllium, copper-zinc (bronze), copper-tin (brass), 64% iron/36% nickel (Invar™) and 54% iron/29% nickel/17% cobalt (Kovar™), copper-iron, nickel-niobium, nickel-silver, nickel-copper, iron-copper, iron-copper-carbon iron-copper-nickel, iron-chromium, iron-copper-tin, copper-nickel-titanium-aluminum, nickel-copper-titanium, copper/tungsten, copper/molybdenum, aluminum/silicon carbide, aluminum/aluminum nitride, copper/aluminum, silver/Invar™, copper/cubic boron nitride, copper/diamond and copper/high conductivity carbon fiber.

20. The process of claim 18 wherein the functional insert powder composition is comprised of a metal composition selected from the group consisting of copper, nickel, iron, beryllium, aluminum, silver, copper-beryllium, copper-zinc (bronze), copper-tin (brass), 64% iron/36% nickel (Invar™) and 54% iron/29% nickel/17% cobalt (Kovar™), copper-iron, nickel-niobium, nickel-silver, nickel-copper, iron-copper, iron-copper-carbon, iron-copper-nickel, iron-chromium, iron-copper-tin, copper-nickel-titanium-aluminum, nickel-copper-titanium, copper/tungsten, copper/molybdenum, aluminum/silicon carbide, aluminum/aluminum nitride, copper/aluminum, silver/Invar™, copper/cubic boron nitride, copper/diamond and copper/high conductivity carbon fiber.

21. The process of claim 18 wherein the metal body is solid metal.

22. The process of claim 18 wherein the functional insert powder composition is a loose powder.

23. The process of claim 18 wherein the sintered functional insert is infiltrated with a molten metal compound.

24. The process of claim 18 wherein the metal body is a compact of a surrounding body powder composition and the surrounding body powder composition is compacted prior to sintering; and
wherein the surrounding body powder composition and the functional insert powder composition are sintered simultaneously.

25. The process of claim 24 further comprising:
infiltrating the sintered functional insert composition or the sintered surrounding body composition or both with a molten metal compound.

26. The process of claim 18 wherein the metal body is a compact of a surrounding body powder composition and the surrounding body powder composition is compacted prior to sintering;
wherein the functional insert powder composition is compacted prior to sintering; and,
wherein the surrounding body powder composition and the functional insert powder composition are sintered simultaneously.

27. The process of claim 26 further comprising:
infiltrating the sintered surrounding body or the sintered functional insert or both with a molten metal compound.

28. The process of claim 27 wherein the process produces a functionally-graded metal substrate that has a least two discrete portions, a functional insert and a surrounding body, in the x-y plane, and wherein the surrounding body surrounds the functional insert.

29. The process of claim 28 wherein the surrounding body powder composition contains copper/tungsten powder; and
wherein copper is present in the amount from about of 5% to about 50% by weight; and wherein the functional insert powder composition comprises copper/tungsten powder containing from about 20% to about 80% by weight copper.

30. The process of claim 29 wherein the molten metal compound is copper.

31. The process of claim 18 wherein the functional insert powder composition contains at least one metal powder and wherein the sintering temperature is about equal to or greater than the melting temperature or the eutectic temperature of at least one metal powder.

32. A process for making a functionally-graded metal substrate comprises:

compacting a surrounding body powder composition having a cavity therein;

placing a functional insert powder composition into the compact of the surrounding body composition;

sintering the compact containing functional insert powder composition and the compact containing the surrounding body powder composition simultaneously; and, infiltrating the sintered functional insert or the sintered surrounding body or both with a molten metal to form a metal substrate that has a functional insert and a surrounding body that surrounds the functional insert.

33. The process of claim 32 wherein the molten metal is a metal that melts at about 1400 deg. C. or less.

34. The process of claim 33 wherein the surrounding body surrounds the functional insert in at least two dimensions; and, wherein both the surrounding body and the functional insert comprise copper/tungsten or copper/molybdenum, and wherein the concentration of copper in the functional insert is greater than the concentration of copper in the surrounding body.

35. The process of claim 34 wherein the functional insert extends from a top surface of the functionally-graded metal substrate to the bottom surface of the substrate; and wherein a heat-generating component is attached to the functional insert.

36. A process for making a functionally-graded metal substrate comprising:

compacting a surrounding body powder composition having a cavity therein;

compacting a functional insert powder composition to form a compact;

placing the compact of the functional insert powder composition into the compact of the surrounding body composition; and, sintering the compact containing functional insert powder composition and the compact containing the surrounding body powder composition simultaneously.

37. A process for making a functionally-graded metal substrate, the process comprising:

placing a solid functional insert in the cavity of a solid metal body; and, bonding the metal body and the functional insert to form a metal substrate having a functional insert and surrounding body in the x-y plane.

38. The process of claim 37 wherein bonding is achieved via brazing or pressure-assisted or pressureless diffusion bonding.

39. The functionally-graded metal substrate of claim 12 wherein the heat-generating component is attached to the functional insert and the surrounding body constrains the dimensional expansion of the functional insert in the x-y plane during thermal cycling.

40. The functionally-graded metal substrate of claim 17 wherein the functional insert physically accommodates the heat-generating component to facilitate heat transfer and the surrounding body constrains the dimensional expansion of the functional insert in the x-y plane during thermal cycling.

41. The process of claim 35 wherein the functional insert has a thermal conductivity that is greater than the surrounding body and the functional insert physically accommodates the heat-generating component to facilitate heat transfer, and wherein the surrounding body has a CTE that is lower than the functional insert and the surrounding body constrains the dimensional expansion of the functional insert in the x-y plane during thermal cycling.

* * * * *

US006114048C1

(12) EX PARTE REEXAMINATION CERTIFICATE (5867th)

United States Patent
Jech et al.

(10) Number: US 6,114,048 C1
(45) Certificate Issued: Aug. 21, 2007

(54) FUNCTIONALLY GRADED METAL SUBSTRATES AND PROCESS FOR MAKING SAME

(75) Inventors: David E. Jech, Tucson, AZ (US); Jordan P. Frazier, Tucson, AZ (US); Richard H. Sworden, Tucson, AZ (US); Juan L. Sepulveda, Tucson, AZ (US)

(73) Assignee: Brush Wellman Ceramic Products, Tucson, AZ (US)

Reexamination Request:
No. 90/007,479, Mar. 24, 2005

Reexamination Certificate for:
Patent No.: 6,114,048
Issued: Sep. 5, 2000
Appl. No.: 09/148,126
Filed: Sep. 4, 1998

(51) Int. Cl.
*B22F 7/00* (2006.01)
*B22F 3/26* (2006.01)

(52) U.S. Cl. .................. 428/547; 428/686; 428/655; 428/650; 428/649; 428/637; 428/634; 428/627; 428/620; 428/618; 428/613; 428/610; 428/577; 428/569; 428/567; 428/555; 428/553; 428/550; 228/246; 257/720; 257/796; 257/E23.105; 257/E23.109; 257/E23.112; 361/679; 361/704; 361/705; 361/707; 361/708; 361/709; 361/719; 419/10; 419/27; 419/38; 419/6; 419/66; 419/7; 419/8; 419/9

(58) Field of Classification Search ................ None
See application file for complete search history.

(56) References Cited

U.S. PATENT DOCUMENTS 6,219,364 B1 * 4/2001 Dei ............................. 372/36

FOREIGN PATENT DOCUMENTS

JP      06334074 A   * 12/1994
JP      09045828 A   *  2/1997

* cited by examiner

*Primary Examiner*—Stephen Stein

(57) ABSTRACT

The invention provides for a functionally-graded metal substrate that is made of at least two metal compositions, a functional insert and a surrounding body that surrounds the functional insert. In a preferred embodiment of the invention a functional insert powder composition of loose powder metal is placed in a compact of a surrounding body powder composition and both metal compositions are sintered in a sintering furnace to form a sintered part. The sintered part is infiltrated in part or in whole with a molten metal compound to produce a functionally graded metal substrate having a density of at least 90% of theoretical. A heat-generating component such as a chip can be attached to the metal substrate for use in microelectronic packaging. When the functionally-graded metal substrate has two discrete compositions of copper/tungsten the surrounding body which has a CTE that ranges from about 5.6ppm/° C. to about 7 ppm/° C. constrains the expansion of the functional insert which has a thermal conductivity that ranges from about 200 W/mK to about 400 W/mK.

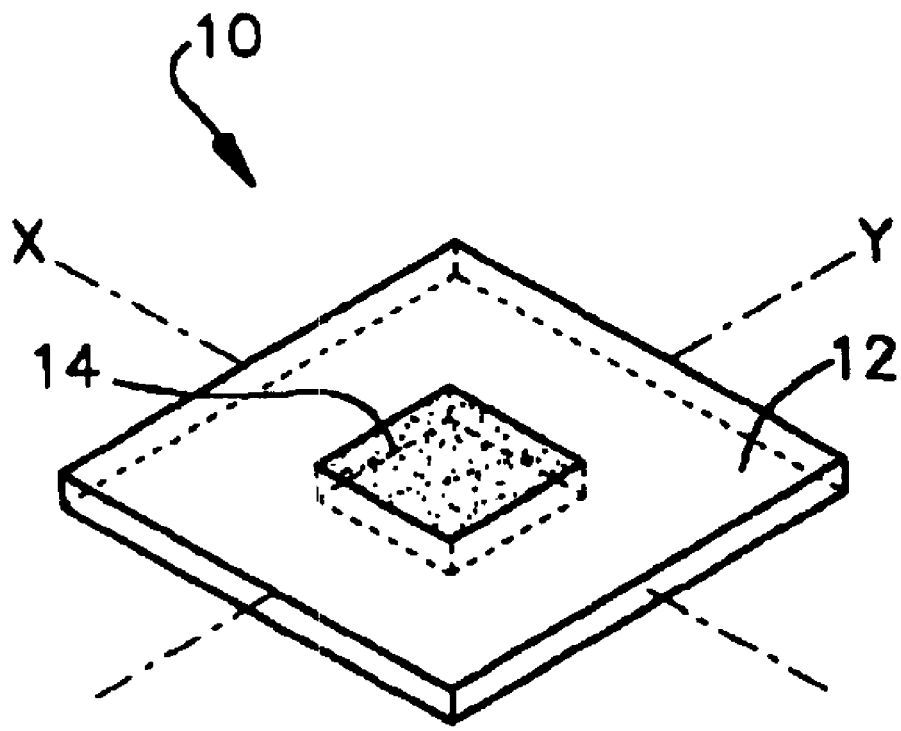

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 8–10, 16, 17, 23–30, 32–36, 40 and 41 is confirmed.

Claims 1–7, 11–15, 18–22, 31 and 37–39 are cancelled.

* * * * *